United States Patent [19]

Fong et al.

[11] Patent Number: 5,052,102
[45] Date of Patent: Oct. 1, 1991

[54] LASER INDUCED ELECTRICAL CONNECTION OF INTEGRATED CIRCUITS

[75] Inventors: Stewart O. Fong, Torrance; Flora Yeung, Augora Hills, both of Calif.

[73] Assignee: Shell Oil Company, Houston, Tex.

[21] Appl. No.: 367,648

[22] Filed: Jun. 19, 1989

[51] Int. Cl.$^5$ ............................................. H05K 3/34
[52] U.S. Cl. .................................. 29/840; 219/121.85; 427/53.1; 437/173
[58] Field of Search ................. 29/840, 740; 427/53.1; 219/121.85; 338/195; 437/173

[56] References Cited

U.S. PATENT DOCUMENTS 3,801,366  4/1974  Lemelson ................... 427/53.1 X
4,529,090  6/1985  Bottka et al. .................... 427/53.1
4,694,138  9/1987  Oodaira et al. ............... 219/121.85
4,778,693  10/1988  Drozdowicz et al. ............. 427/53.1
4,868,068  9/1989  Yamaguchi et al. ........... 427/531 X

*Primary Examiner*—Carl E. Hall
*Assistant Examiner*—Carl E. Arles

[57] ABSTRACT

Process for electrically connecting non-planar electronic elements to a motherboard. A radiation sensitive metallic conversion compound is applied as a coating which extends at least between electrical connection sites on the electronic element and motherboard. The metallic conversion coating is then selectively irradiated by laser to convert the coating into a metallic electrical connection which extends between the non-planar electronic element and motherboard.

11 Claims, 2 Drawing Sheets

LASER INDUCED ELECTRICAL CONNECTION OF INTEGRATED CIRCUITS

BACKGROUND OF THE INVENTION

1. Field of the Invention

The present invention relates generally to the interconnection of electronic elements to electronic motherboard assemblies. More particularly, the present invention involves electrically connecting electronic elements, such as integrated circuits and chips, to a silicon motherboard by laser induced metallization.

2. Description of Related Art

An extremely important aspect of any complex electronic assembly is the interconnection of the electronic elements with the motherboard. Previous interconnections between integrated circuits in such hybrid assemblies have been accomplished using wire bonding or tab bonding. Both of these techniques are bulky and introduce wire inductances. These inductances preclude distortion-free operation of the assembly at high frequencies. Accordingly, there presently is a need to provide improved interconnections between electronic elements and their motherboard.

Laser induced metallization has been used to deposit metal layers onto complex circuit boards U.S. Pat. Nos. 4,340,617 and 4,359,485 disclose exemplary processes in which an organometallic layer is exposed to laser radiation to provide selective conversion of the layer into metal. These laser writing processes—also known as laser pantography—have been in use since the early 1980's. An exemplary laser pantography system is discussed in the article by McWilliams et al., entitled "Wafer-Scale Laser Pantography: Fabrication of n-Metal-Oxide-Semiconductor Transistors and Small-Scale Integrated Circuits by Direct-Write Laser-Induced Pyrolitic Reactions," (Appl. Phys. Lett. 43 (10), Nov. 15, 1983). The contents of these patents and articles are hereby incorporated by reference.

The above-mentioned laser pantography techniques have been used to convert metallo-organic coatings into metal layers on planar surfaces. However, the use of such laser induced conversion techniques has not been extended to writing on non-planar surfaces.

SUMMARY OF THE INVENTION

In accordance with the present invention, a process is disclosed for connecting electronic elements to motherboards by laser induced metallization. The present invention is based on the discovery that prior laser induced metallization techniques can be utilized to provide electrical connections between the non-planar surfaces of the electronic elements and motherboards.

The process of the present invention involves a motherboard having an electronic element mounted thereon wherein the motherboard has at least one electrical connection site and the electronic element has at least one electrical connection site. The electrical connection site on the electronic element is displaced above the motherboard and therefore is non-planar with respect to the motherboard. A radiation sensitive metallic conversion compound is applied to the motherboard and electronic element to form a metallic conversion coating extending at least from the motherboard connection site to the non-planar electronic element connection site. The metallic conversion coating is then selectively irradiated to convert the conversion coating to a metallic electrical connection between the two connection sites. The unconverted metallic conversion coating surrounding the newly formed metallic electrical connection is then removed to provide an electrical connection between the electronic element and motherboard.

As a feature of the present invention, it was discovered that a preferred electrical connection is provided when the thickness of the conversion coating is increased around the perimeter of the electronic element where it is mounted to the motherboard. This increased thickness provides reinforcement which prevents undesirable breaks in the electronic connection. It was also discovered that by cutting the edge of the electronic element to provide a slope area instead of the conventional 90° step, better electrical connections can be made across the nonplanar surfaces. As another feature of the present invention, the same well-defined and highly accurate writing capabilities provided by known laser pantography are used to produce extremely accurate electrical connections which are not bulky and do not introduce wire inductances into the electronic assembly. The laser induced interconnections in accordance with the present invention eliminate wire bonding and tab bonding techniques which, as mentioned above, introduce variable inductances and signal ringing.

The above-discussed and many other features and attendant advantages of the present invention will become apparent as the invention becomes better understood by reference to the following detailed description when considered in conjunction with the accompanying drawings.

DETAILED DESCRIPTION OF THE PREFERRED EMBODIMENTS

The present invention has application to electronic assemblies wherein one or more electronic elements must be electrically connected to a motherboard. The process may be used for interconnecting silicon chips, integrated circuits and any other conventional electronic assemblies to a motherboard. The process is especially well suited for making interconnections for complex electronic assemblies which require highly accurate electrical connections which allow distortion-free operation at high frequencies. The following description will be limited to the electrical interconnection of a silicon chip to a conventional motherboard with it being understood that the process can be used to electrically interconnect a wide variety of electronic assemblies to a motherboard.

Figure 1:
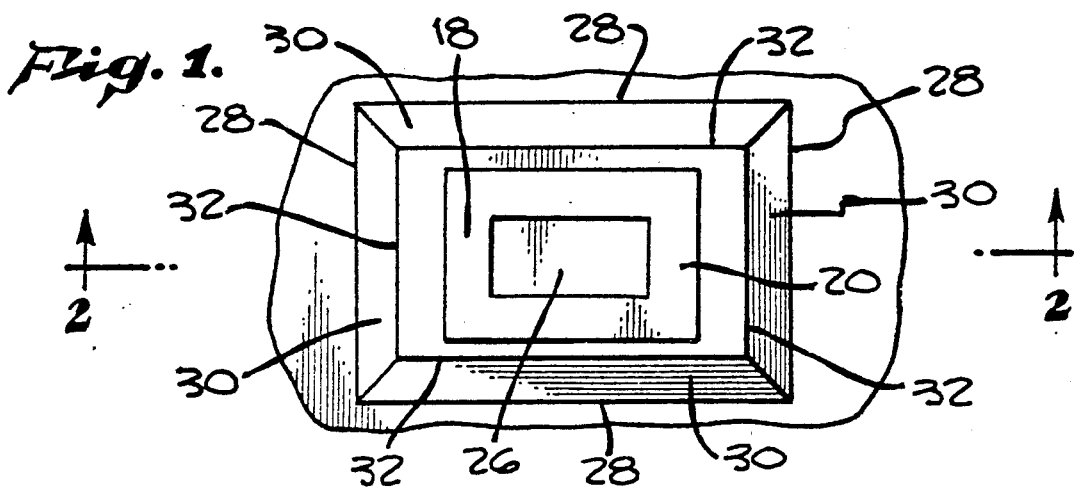
FIG. 1 is a top view of a silicon chip electronic element which is located above a motherboard to which it will be mounted and electrically connected.
Figure 2:
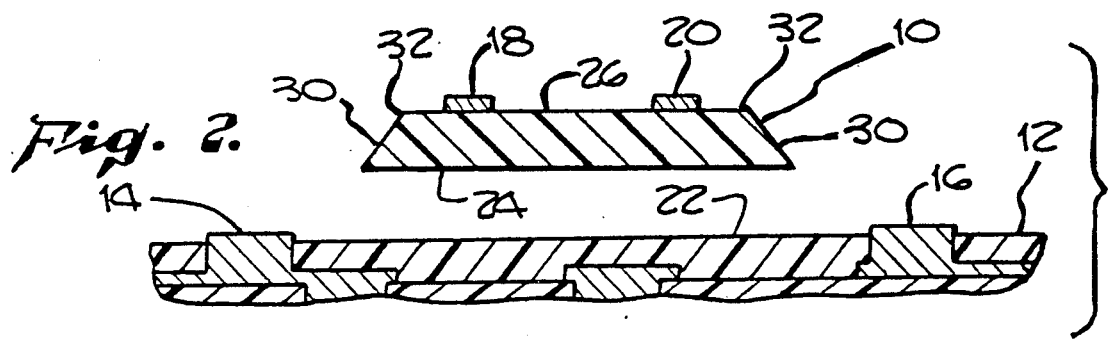
FIG. 2 is a view of FIG. 1 taken in the 2—2 plane.

FIGS. 1 and 2 depict a silicon chip 10 and motherboard 12. The motherboard 12 includes electrical connection sites in the form of metal-filled vias 14 and 16.

The motherboard 12 is a conventional circuit board made from alternating layers of metal and polyimide. Other types of motherboards which may be used include those made from printed circuit boards, such as laminates of polyimide and fibers or of epoxy and glass fibers. The silicon chip 10 includes electrical connection sites 18 and 20 which are to be connected to the electrical connection sites 14 and 16, respectively.

The motherboard 12 has a top surface 22 upon which the lower surface 24 of the chip 10 is mounted. The chip 10 also includes an upper surface 26 which is elevated away from the top surface 22 of the motherboard 12 when the chip 10 is mounted thereon. As best shown in FIG. 1, the periphery around the chip 10 defines a mounting boundary 28. To assure continuous metallization along the nonplanar surfaces, the conventionally sawed straight up and down sides of the chip are sawed with a bevel to form a slanted profile. The sides 30 of the silicon chip 10 extend upwardly and inwardly away from the mounting boundary 28 and terminate in an upper periphery 32.

Figure 3:
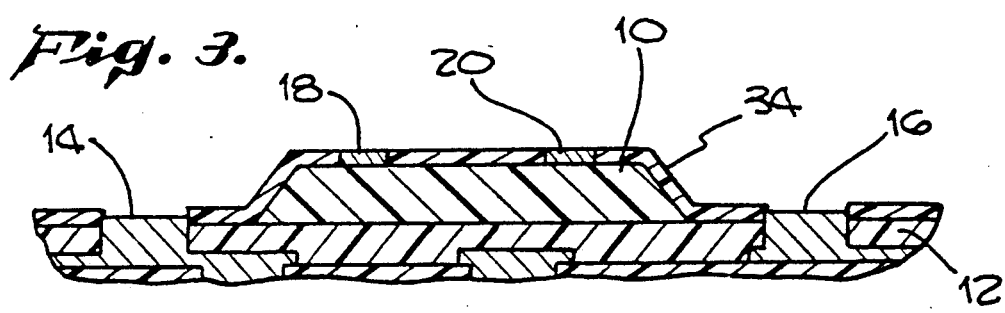
FIGS. 3-6 show the silicon chip and motherboard at various stages during a preferred process in accordance with the present invention wherein laser induced electrical connections are made between the silicon chip and motherboard.

A first preferred step in accordance with the present process is the coating of the motherboard and silicon chip with polyimide. The procedures by which thin polyimide coatings are applied to silicon chips mounted on motherboards are well-known and conventional. The processes involve spinning a coating of polyimide or other suitable polymer onto the top of the silicon chip-motherboard assembly. The electrical contacts on the silicon chip and motherboard are exposed by photoresist lithography as is also conventionally known. The coating of the silicon chip and motherboard with a polyimide layer is a conventional process which does not form part of the invention and will not be described in detail. Any of the known photoresist lithography techniques involving oxygen/CF$_4$ etching through silicon dioxide layers can be used so long as the resulting silicon chip and motherboard assembly has a suitable plastic coating in accordance with conventional procedures. The electronic assembly having a polyimide coating 34 thereon is shown in FIG. 3 wherein the motherboard vias 14 and 16 and chip connection sites 18 and 20 are not covered by the polyimide due to prior lithography.

Figure 4:
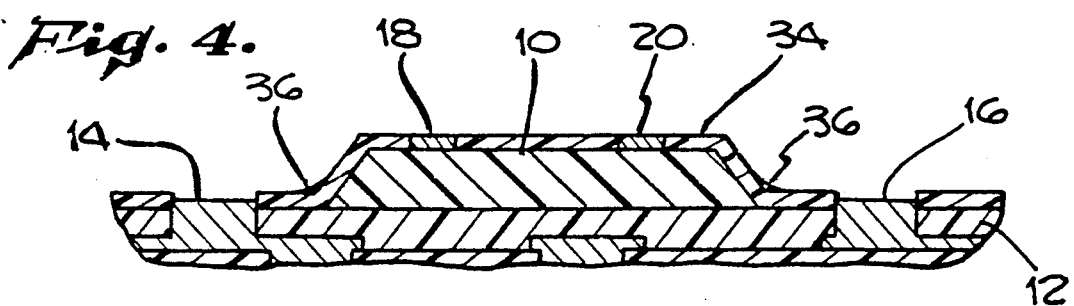

At this point, a pool of the metallic conversion coating may be applied around the mounting boundary 28. The pool which is formed is shown at 36 in FIG. 4. The metallic conversion compound can be any of the known radiation sensitive organometallic compounds which are conventionally used for laser induced deposition of metal on semiconductor surfaces. Preferred metallic conversion compounds are polymers having a metal salt impregnated therein. The polymeric network is a high viscosity material that fills up the boundary area and provides a continuous surface along the edges of the boundary area. Such metal impregnated polymers are well known, and an example is silver nitrate doped poly-n-vinyl pyrrolidone. The metal salt impregnated polymer is typically a viscous solution which is applied in the form of a rim around the chip to motherboard interface. After the evaporation of the solvent, a solid polymeric ramp is formed around the mounting boundary. A suitable laser beam is then used to convert the metal salt impregnated polymer to conductive metal lines joining the motherboard surface 22 to the chip surfaces 30 and 32. The residual polymer can be removed with solvent, such as water, leaving the laser written metal line on the chip and motherboard. This thick metal line deposition is an optional step to prevent undesirable breaks in the electronic connection. For smooth continuous surfaces, this step may be omitted and an organometallic coating may be applied directly.

Figure 5:
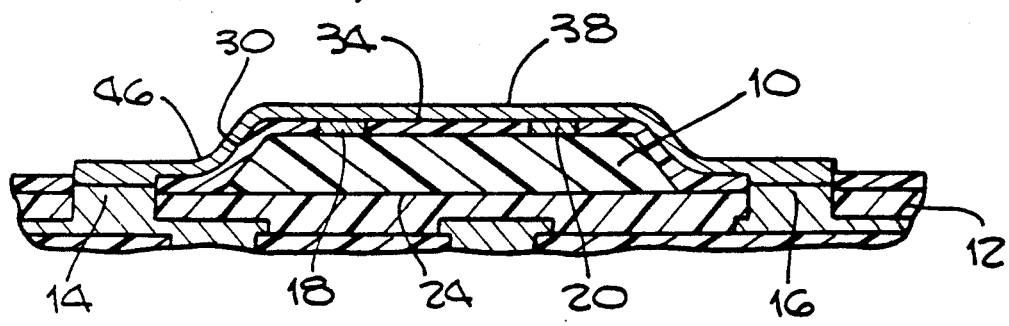

In the next step of the process, the entire electronic assembly is coated with a layer of organometallic compound as shown in FIG. 5 at 38. A particularly preferred solution is silver neodecanoate in xylene. The percentage of silver in solution is kept in the normal ranges used for applying such metallic conversion coatings. A suitable range of silver neodecanoate concentration is between 5 to 15 weight percent. The coating 38 is applied by conventional techniques for spin coating liquids onto electronic assemblies. The thickness of the coating is preferably between about 2 to 20 microns. As show in FIG. 5, the metallic conversion coating 38 extends between and covers the motherboard filled vias 14 and 16 and the chip connection sites 18 and 20.

Figure 6:
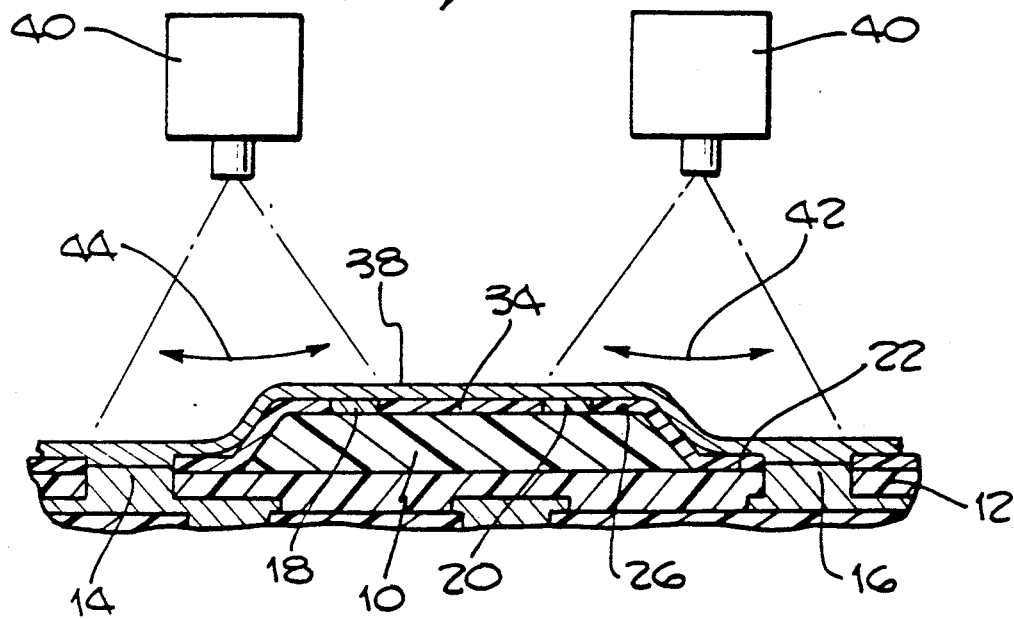

In the next step of the process, the metallic conversion coating extending between the motherboard filled vias 14 and 16 and chip connection sites 18 and 20 are selectively irradiated with a sufficiently intense radiation source at a suitable wavelength to convert the conversion coating to a metallic electrical connection between the respective chip connection sites and motherboard vias. This step is schematically shown in FIG. 6 wherein a laser beam source 40 is focused onto the metallic conversion coating 38 and is moved as represented by arrows 42 and 44. The laser must have focusing optics which are capable of autofocusing to thereby allow focusing of the laser beam onto the metallic conversion coating 38 as it travels downward from the upward surface 26 of the chip to the top surface 22 of the motherboard. Such autofocusing lasers are now commercially available from Weidmuller Sensor Systems of Chicago, Ill. A preferred laser is an argon laser tuned to 5145 angstroms. Other wavelengths may be used provided that they have sufficient energy to convert the metallic conversion compound to the desired metal. The laser is used in accordance with conventional procedures for laser pantography. This procedure involves matching the absorption characteristics of the chosen conversion compound with the wavelength of the laser for high conversion efficiency.

Figure 7:
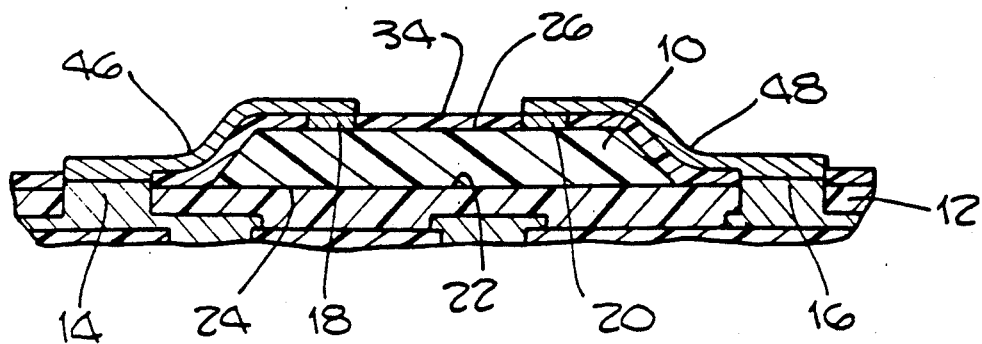
FIG. 7 is a side sectional view of the silicon chip and motherboard showing the final electrical connection in accordance with the present invention.

After laser induced conversion, the remaining, unconverted metallic conversion compound is removed from the assembly by washing in a suitable solvent. The remaining converted metal provides electrical contacts 46 and 48 as shown in FIG. 7. The thickness of the contacts 46 and 48 is typically around 500 angstroms. This thickness provides a preferred electrical connection. Electrical connections which are thinner are possible; however, thicknesses of below about 500 angstroms are not desirable since the chances for breaks in the connection are increased.

As a feature of present invention, more than one layer of metallic conversion compound may be applied to the electronic assembly so that multiple layers of electrical connections and variable thicknesses are possible. This feature is particularly well suited for complex electronic assemblies where multiple connections are required. When such multiple layer connections are desired, the process is conducted in the same manner as previously described except that more than one layer of metallic conversion compound 38 is spun onto the assembly. Further, the use of multiple metal conversion coatings allows connections to be made with different metals. The procedure for providing electrical connections with different metals would follow the same procedure set forth above except that multiple coatings of metallic conversion compound would be applied wherein the different layers contain different metal salts.

Examples of practice are as follows:

EXAMPLE 1

A four inch diameter (10 cm diameter) conventional motherboard having five silicon chips mounted thereon was spin coated at 2000 rpms in three separate experiments with 4, 8 and 12 drops, respectively, of an organometallic solution containing 11.15 weight percent silver neodecanoate in xylene. The xylene was evaporated at room temperature for 2 hours. Electrical connections were then made between the silicon chips and motherboard using an autofocusing argon laser tuned at 5145 angstroms. The power density and scan speed were $6.5 \times 10^3$ watt/cm$^2$ and 0.25 mm/sec, respectively. The unconverted metallo-organic layer surrounding the laser converted electrical connections was removed by washing with xylene. The resulting electrical connections formed from 12 drops of organometallic solution were 500 angstroms thick and provided suitable electrical connections which do not introduce wire inductances that make distortion-free operation at high frequencies impossible.

EXAMPLE 2

The same procedure was carried out as in Example 1 except that the silver neodecanoate solution was pooled around the perimeter of the silicon chips and allowed to evaporate prior to spin coating of silver neodecanoate solution over the entire assembly. The pooling of the silver neodecanoate around the perimeter of the silicon chips provided a reinforcing line or rim which increased the thickness of electrical connection at the boundary or perimeter where the silicon chip attaches to the motherboard. As previously mentioned, this reinforcement of the electrical connection is preferred since it reduces the chances of fractures occurring in the electrical connection during the useful life of the electronic assembly.

EXAMPLE 3

Electrical connections are made in accordance with the laser induced metal conversion process set forth in Example 1 followed by the application of a second coating of silver neodecanoate in xylene to the electronic assemblies. The same laser writing procedure is then used to induce conversion of the silver neodecanoate to silver connections between different sites on the silicon chip and motherboard.

EXAMPLE 4

Electrical connections are made according to the process set forth in Example 1 followed by spin coating of a solution of copper neodecanoate onto the assembly. The autofocusing laser is then used to convert the copper neodecanoate layer to electrical connections between desired points. In addition, the conversion of the copper neodecanoate, located directly over the silver electrical connections, to copper metal may be used to provide a bi-metal electrical connection.

EXAMPLE 5

Electrical connections are made according to Example 1 except that poly-n-vinyl pyrrolidone containing 60 weight percent silver nitrate is substituted for the silver neodecanoate.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A process for electrically connecting an electronic element to a motherboard comprising the steps of:
   (a) providing a motherboard having an electronic element mounted on the surface thereof, said motherboard having at least one electrical connection site and said electronic element having at least one electrical connection site and having sides which extend upwardly and inwardly away from said surface of said motherboard, wherein said electrical connection site of said motherboard and said electrical connection site of said electronic element are non-planar with respect to each other;
   (b) applying a sufficient amount of a radiation sensitive metallic conversion compound to said motherboard and electronic element to form a metallic conversion coating extending at least from said motherboard connection site to said electronic element connection site;
   (c) selectively radiating said metallic conversion coating with a sufficient intensity of radiation at an appropriate wavelength to convert said conversion coating to a metallic electrical connection between said non-planar electrical connection sites on said motherboard and on said electronic element; and
   (d) removing the unconverted metallic conversion coating surrounding the metallic electrical connection to thereby provide for an electrical connection between said electronic element and said motherboard.

2. A process according to claim 1 wherein a laser is used in selectively radiating said metallic conversion coating.

3. A process according to claim 2 wherein said radiation sensitive metallic conversion compound is an organometallic.

4. A process according to claim 3 wherein said organometallic is a polymer impregnated with a metal salt.

5. A process according to claim 4 wherein said polymer is poly-n-vinyl pyrrolidone and said metal salt is silver nitrate.

6. A process according to claim 3 wherein said organometallic is silver neodecanoate.

7. A process according to claim 1 wherein the periphery around said electronic element where said electronic element is mounted to said motherboard defines an electronic element mounting boundary, said process including the step of increasing the thickness of said metallic conversion coating at said electronic element mounting boundary.

8. A process according to claim 7 wherein said radiation sensitive metallic conversion compound is applied by first forming a pool of said metallic conversion compound at said mounting boundary and then applying additional metallic conversion compound to form said metallic conversion coating to thereby increase the thickness of said coating at said mounting boundary.

9. A process according to claim 7 wherein said electronic element is a silicon chip having sides which extend upwardly and inwardly away from said mounting boundary and terminate in an upper edge periphery.

10. A process according to claim 9 wherein the electrical connection site on said silicon chip is located adjacent to said upper edge periphery.

11. A process according to claim 1 wherein a plurality of metallic conversion coatings are formed on said motherboard and electronic element.

* * * * *

UNITED STATES PATENT AND TRADEMARK OFFICE
CERTIFICATE OF CORRECTION

PATENT NO. : 5,052,102
DATED : October 1, 1991
INVENTOR(S) : STEWART O. FONG and FLORA YEUNG It is certified that error appears in the above-identified patent and that said Letters Patent is hereby corrected as shown below:

On title page, item [73] Assignee, delete "Shell Oil Company, Houston, Tex." and insert therefor -- Hughes Aircraft Company, Los Angeles, Calif. --.

Signed and Sealed this

Fifth Day of July, 1994

*Attest:*

BRUCE LEHMAN

*Attesting Officer*     Commissioner of Patents and Trademarks